(12) United States Patent
Bazzani et al.

(10) Patent No.: US 11,728,805 B2
(45) Date of Patent: Aug. 15, 2023

(54) CIRCUITS AND OPERATING METHODS THEREOF FOR MONITORING AND PROTECTING A DEVICE

(71) Applicant: MACOM Technology Solutions Holdings, Inc., Lowell, MA (US)

(72) Inventors: Cristiano Bazzani, Irvine, CA (US); Damian McCann, Rossmoor, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/847,896

(22) Filed: Apr. 14, 2020

(65) Prior Publication Data
US 2020/0244258 A1 Jul. 30, 2020

Related U.S. Application Data

(63) Continuation of application No. 15/181,841, filed on Jun. 14, 2016, now Pat. No. 10,637,460.

(51) Int. Cl.
*H03K 17/16* (2006.01)
*H01L 29/20* (2006.01)
*H01L 29/778* (2006.01)
*H03K 5/24* (2006.01)
(Continued)

(52) U.S. Cl.
CPC ....... *H03K 17/165* (2013.01); *H01L 29/2003* (2013.01); *H01L 29/7787* (2013.01);
(Continued)

(58) Field of Classification Search
CPC . H03F 1/52; H03F 1/523; H03F 3/217; H03F 3/72; H03F 3/2171; H03F 1/22;
(Continued)

(56) References Cited

U.S. PATENT DOCUMENTS

| 3,906,310 | A | 9/1975 | Esashika |
| 4,078,247 | A | 3/1978 | Albrecht |

(Continued)

FOREIGN PATENT DOCUMENTS

| CN | 1106572 | 8/1995 |
| CN | 105518865 | 4/2016 |

(Continued)

OTHER PUBLICATIONS

Written Opinion of the International Preliminary Examining Authority for International Application No. PCT/US2016/046159, dated Oct. 10, 2017.
(Continued)

*Primary Examiner* — Danny Nguyen
(74) *Attorney, Agent, or Firm* — Perilla Knox & Hildebrandt LLP; Jason M. Perilla

(57) ABSTRACT

Circuits for protecting devices, such as gallium nitride (GaN) devices, and operating methods thereof are described. The circuits monitor a magnitude of the current in a device and reduce the magnitude of the current and/or shut down the device responsive to the magnitude of the current exceeding a threshold. These circuits safeguard devices from damaging operating conditions to prolong the operating life of the protected devices.

20 Claims, 6 Drawing Sheets

(51) Int. Cl.
*H03F 1/22* (2006.01)
*H03F 3/217* (2006.01)
*H03K 17/082* (2006.01)
*H03F 3/72* (2006.01)
*G05F 1/573* (2006.01)
*H02H 3/08* (2006.01)
*H03F 1/52* (2006.01)
*H02H 9/02* (2006.01)

(52) U.S. Cl.
CPC ........... *H03F 1/223* (2013.01); *H03F 3/2171* (2013.01); *H03F 3/72* (2013.01); *H03K 5/2472* (2013.01); *H03K 17/0828* (2013.01); *G05F 1/573* (2013.01); *H02H 3/08* (2013.01); *H02H 9/02* (2013.01); *H03F 1/52* (2013.01); *H03F 2200/462* (2013.01); *H03F 2200/78* (2013.01)

(58) Field of Classification Search
CPC .......... H03F 2200/462; H03F 2200/78; H03K 17/0822; H03K 2217/0027; H03K 17/082; H03K 17/165; H03K 17/0828; H03K 17/16; H03K 5/24; H02H 9/02; H02H 9/025; H02H 3/087; H02H 3/08; H02H 3/023; G05F 1/573; G05F 1/575; H02J 2007/0039; H02J 7/0016; H01L 29/2003; H01L 29/7787; H01L 29/20; H01L 29/778
USPC .................................. 361/86–87, 93.7–93.9
See application file for complete search history.

(56) References Cited

U.S. PATENT DOCUMENTS

| | | | |
|---|---|---|---|
| 4,127,885 A | 11/1978 | Adam et al. | |
| 4,442,416 A | 4/1984 | Epsom et al. | |
| 5,061,863 A | 10/1991 | Mori et al. | |
| 5,389,813 A | 2/1995 | Schwob | |
| 5,510,753 A | 4/1996 | French | |
| 5,574,610 A | 11/1996 | Tachick et al. | |
| 5,712,592 A | 1/1998 | Stimson et al. | |
| 5,973,569 A * | 10/1999 | Nguyen | H03F 3/2171 330/10 |
| 5,986,500 A | 11/1999 | Park et al. | |
| 5,994,965 A | 11/1999 | Davis et al. | |
| 6,552,620 B2 | 4/2003 | Gitsevich et al. | |
| 6,560,081 B1 | 5/2003 | Vashchenko et al. | |
| 6,650,173 B1 | 11/2003 | Khouri et al. | |
| 6,774,718 B2 | 8/2004 | Ichitsubo et al. | |
| 6,778,018 B2 | 8/2004 | Joly et al. | |
| 6,784,837 B2 | 8/2004 | Revankar et al. | |
| 6,950,636 B2 | 9/2005 | Rozenblit et al. | |
| 7,031,127 B1 | 4/2006 | D'Aquino et al. | |
| 7,268,621 B2 * | 9/2007 | Kanoh | H03F 1/52 330/10 |
| 7,271,658 B2 | 9/2007 | Matsushita et al. | |
| 7,328,041 B2 | 2/2008 | Tasaka | |
| 7,352,237 B2 | 4/2008 | Snelgrove et al. | |
| 7,463,469 B2 * | 12/2008 | Jacobs | H03F 1/523 361/93.7 |
| 7,471,493 B1 | 12/2008 | Huang et al. | |
| 7,586,720 B1 | 9/2009 | Ozard | |
| 7,593,204 B1 | 9/2009 | Iversen et al. | |
| 7,876,156 B2 | 1/2011 | Tanaka et al. | |
| 7,937,049 B2 | 5/2011 | Phillips et al. | |
| 7,994,862 B1 | 8/2011 | Pukhovski | |
| 8,334,722 B2 | 12/2012 | Sorrells et al. | |
| 8,344,806 B1 | 1/2013 | Franck et al. | |
| 8,477,832 B2 | 7/2013 | Sawatzky | |
| 8,493,160 B2 | 7/2013 | Nicole et al. | |
| 8,624,678 B2 | 1/2014 | Scott et al. | |
| 8,710,615 B2 | 4/2014 | Schmidt | |
| 8,774,737 B2 | 7/2014 | Mori et al. | |
| 8,841,971 B1 | 9/2014 | Geis et al. | |
| 8,847,688 B1 | 9/2014 | Mossawir | |
| 8,890,211 B1 | 11/2014 | Mayo et al. | |
| 9,070,506 B2 | 6/2015 | Anderson et al. | |
| 9,184,284 B2 | 11/2015 | Zundel et al. | |
| 9,197,194 B2 | 11/2015 | Reedy et al. | |
| 9,608,102 B2 | 3/2017 | Johnson et al. | |
| 9,722,551 B1 | 8/2017 | Mckinley et al. | |
| 9,768,766 B2 | 9/2017 | Willkofer et al. | |
| 9,911,817 B2 | 3/2018 | Xia et al. | |
| 9,978,858 B2 | 5/2018 | Johnson et al. | |
| 10,132,696 B2 | 11/2018 | Kiep et al. | |
| 2003/0095608 A1 | 5/2003 | Duperray | |
| 2005/0035762 A1 | 2/2005 | Albrecht et al. | |
| 2006/0221528 A1* | 10/2006 | Li | H02M 1/32 361/100 |
| 2006/0256489 A1 | 11/2006 | Ker et al. | |
| 2007/0085754 A1 | 4/2007 | Ella et al. | |
| 2007/0264774 A1 | 11/2007 | Luo et al. | |
| 2008/0211585 A1* | 9/2008 | Karoui | H03F 3/19 330/207 P |
| 2008/0231368 A1* | 9/2008 | Suzaki | H03F 3/19 330/277 |
| 2009/0072315 A1 | 3/2009 | Model et al. | |
| 2009/0169022 A1* | 7/2009 | Kost | H03F 1/523 381/56 |
| 2009/0262034 A1 | 10/2009 | Satoh | |
| 2010/0026387 A1 | 2/2010 | Blednov | |
| 2011/0298538 A1* | 12/2011 | Andrys | H03F 3/189 330/127 |
| 2012/0055230 A1 | 3/2012 | Naruse et al. | |
| 2012/0153349 A1 | 6/2012 | Suzuki | |
| 2013/0049763 A1 | 2/2013 | Jiang et al. | |
| 2013/0099733 A1 | 4/2013 | Park et al. | |
| 2014/0118074 A1 | 5/2014 | Levesque et al. | |
| 2014/0197891 A1 | 7/2014 | Mooney et al. | |
| 2014/0266432 A1 | 9/2014 | Scott et al. | |
| 2014/0266460 A1 | 9/2014 | Nobbe et al. | |
| 2014/0273888 A1 | 9/2014 | Levinger | |
| 2015/0003490 A1 | 1/2015 | Ash et al. | |
| 2015/0116039 A1 | 4/2015 | Ahmed et al. | |
| 2016/0065148 A1* | 3/2016 | Liu | H03F 3/183 361/87 |
| 2016/0094187 A1 | 3/2016 | Staudinger et al. | |
| 2016/0211813 A1 | 7/2016 | Gonzalez | |
| 2016/0285420 A1 | 9/2016 | Jones | |
| 2017/0018617 A1 | 1/2017 | Xia et al. | |
| 2017/0093353 A1 | 3/2017 | Lautzenhiser | |
| 2017/0104092 A1 | 4/2017 | Tanaka et al. | |
| 2017/0126002 A1 | 5/2017 | Gittemeier | |
| 2017/0131099 A1 | 5/2017 | Aoyama et al. | |
| 2017/0294528 A1 | 10/2017 | Ren et al. | |
| 2017/0345922 A1 | 11/2017 | Iucolano et al. | |
| 2017/0359033 A1 | 12/2017 | Bazzani et al. | |
| 2018/0062499 A1 | 3/2018 | Yamamoto et al. | |
| 2018/0109228 A1 | 4/2018 | Kelly | |
| 2018/0158917 A1 | 6/2018 | Odnoblyudov et al. | |
| 2019/0028065 A1 | 1/2019 | Mahon et al. | |
| 2019/0028066 A1 | 1/2019 | Mahon et al. | |
| 2019/0078941 A1 | 3/2019 | Mahon et al. | |

FOREIGN PATENT DOCUMENTS

| | | |
|---|---|---|
| DE | 102005043270 | 3/2007 |
| DE | 102007039951 | 2/2009 |
| EP | 2565608 | 3/2013 |
| JP | H03258008 | 11/1991 |
| JP | H09229778 | 9/1997 |
| WO | 2007035777 | 3/2007 |
| WO | 2015029159 | 3/2015 |

OTHER PUBLICATIONS

Ch. II International Preliminary Report on Patentability for International Application No. PCT/US2016/046159, dated Feb. 28, 2018.

(56) References Cited

OTHER PUBLICATIONS

Written Opinion of the International Preliminary Examining Authority for International Application No. PCT/US2017/056285 dated Sep. 11, 2018.
Ch. II International Preliminary Report on Patentability for International Application No. PCT/US2017/056285 dated Dec. 12, 2018.
Written Opinion of the International Preliminary Examining Authority for International Application No. PCT/US2017/036717 dated May 24, 2018.
Ch. II International Preliminary Report on Patentability for International Application No. PCT/US2017/036717 dated Sep. 3, 2018.
Invitation to Pay Additional Fees for International Application No. PCT/US2018/042757 dated Oct. 9, 2018.
International Search Report and Written Opinion for International Application No. PCT/US2018/042757 dated Dec. 10, 2018.
International Search Report and Written Opinion for International Application No. PCT/US2018/050859 dated Dec. 11, 2018.
Kuzmik et al., Determination of channel temperature in AlGaN/GaN HEMTs grown on sapphire and silicon subsliates using DC characterization method. IEEE Transactions on Electron Devices. Aug. 2002, 49(8):1496-1498.
Schwitter et al., Impact of bias and device structure on gate junction temperature in AlGaN/GaN-on-Si HEMTs. IEEE Transactions on Electron Devices. May 2014; 61(5):1327-34.
Schwitter et al., Parameter Extractions for a GaAs pHEMT thermal model using a TFR—heated test structure. IEEE Transactions on Electron Devices. Mar. 2015; 62(3):795-801.
Schwitter et al., Study of gate junction temperature in GaAs pHEMTs using gate metal resistance thermometry. IEEE Transactions on Electron Devices. Oct. 2013; 60(10):3358-64.
Schwitter et al., Transient gate resistance thermometry demonstrated on GaAs and GaN FET. 2016 IEEE MTT-S International Microwave Symposium (IMS). 2016, 4 pages.
International Search Report and Written Opinion for International Application No. PCT/US2017/036717 dated Sep. 18, 2017.
International Search Report and Written Opinion for International Application No. PCT/US2017/056285 dated Jan. 3, 2018.
Koyama et al., Implications of Using kW-level GaN Transistors in Radar and Avionic Systems. 2015 IEEE International Conference on Microwaves Communications, Antennas and Electronic Systems. Nov. 2, 2015. 4 pages.
Sheng; et al. Coupled microstrip line microwave phase shifter using ferroelectric thin film varactors. J of Applied Physics. Feb. 15, 2012; 111(4):44506.
International Search Report and Written Opinion for International Application No. PCT/US2016/046159 dated Nov. 17, 2016.
Sun et al.. A new ESD protection structure for High-Speed GaAs RF ICs. IEEE Electron Device Letters. Mar. 2005; 26(3):133-5.

\* cited by examiner

CIRCUITS AND OPERATING METHODS THEREOF FOR MONITORING AND PROTECTING A DEVICE

CROSS-REFERENCE TO RELATED APPLICATIONS

This application is a continuation of U.S. Non-Provisional application Ser. No. 15/181,841, filed Jun. 14, 2016, the entire contents of which is hereby incorporated herein by reference.

BACKGROUND

Technical Field

The technology relates to circuits to safeguard a device, such as a gallium nitride (GaN) device, from operating conditions that can damage or destroy the device.

Discussion of the Related Art

GaN semiconductor material has received appreciable attention in recent years because of its desirable electronic and electro-optical properties. GaN has a wide, direct bandgap of about 3.4 eV. Because of its wide bandgap, GaN is more resistant to avalanche breakdown and has a higher intrinsic field strength compared to more common semiconductor materials, such as silicon and gallium arsenide. In addition, GaN is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, GaN materials may be used as active circuit components in semiconductor amplifiers for radio-frequency (RF) communications, radar, and microwave applications.

SUMMARY

According to one aspect, a system for providing an output signal to a load is provided. The system includes a first transistor having a drain terminal constructed to provide the output signal to the load and a gate terminal constructed to receive an input signal, a second transistor coupled in series with the first transistor and having a gate terminal, a current sensing circuit coupled to the first transistor and constructed to measure a magnitude of a current in the first transistor, a feedback circuit coupled to the current sensing circuit and constructed to generate a feedback signal indicative of whether the magnitude of the current in the first transistor is above a threshold, and a driver circuit coupled to the feedback circuit and the gate terminal of each of the first and second transistors. The driver circuit may be constructed to apply a voltage to the gate terminal of the first transistor and reduce the magnitude of the current in the first transistor by adjusting a gate voltage of the second transistor responsive to the feedback signal indicating that the magnitude of the current in the first transistor is above the threshold.

In one embodiment, the threshold is a configurable threshold. In one embodiment, the first transistor is a gallium nitride (GaN) transistor and the second transistor is a metal-oxide-semiconductor field-effect transistor (MOSFET). In one embodiment, the driver circuit is a GaN sequencer and is further constructed to apply the bias voltage to the gate terminal of the GaN transistor before turning on the MOSFET.

In one embodiment, the current sense circuit includes a current sense resistance coupled in series with the first transistor, a first level-shifter coupled to a first terminal of the current sense resistance, and a second level-shifter coupled to a second terminal of the current sense resistance. In one embodiment, the feedback circuit includes a difference detector constructed to compare a voltage signal indicative the magnitude of the current in the first transistor with a reference voltage that defines the threshold and generate the feedback signal based on the comparison. In one embodiment, the feedback circuit further includes a programmable voltage source constructed to generate the reference voltage and provide the reference voltage to the difference detector.

In one embodiment, the second transistor has a drain terminal coupled to a source terminal of the first transistor. In one embodiment, the system further includes a third transistor having a gate terminal coupled to the driver circuit and a drain terminal coupled to the drain terminal of the second transistor. In one embodiment, the driver circuit is constructed to reduce the magnitude of the current in the first transistor by adjusting a gate voltage of each of the second and third transistors.

According to at least one aspect, a circuit for protecting a gallium nitride (GaN) transistor is provided. The circuit includes a current sensing circuit to measure a magnitude of a current in the GaN transistor, a feedback circuit coupled to the current sensing circuit and constructed to generate a feedback signal indicative of whether the magnitude of the current in the GaN transistor is above a threshold, and a driver circuit constructed to couple to a gate terminal of the GaN transistor and a gate terminal of a transistor coupled in series with the GaN transistor. The driver circuit may be further constructed to receive the feedback signal, apply a bias voltage to the GaN transistor, and reduce the magnitude of the current in the GaN transistor by adjusting a gate voltage of the transistor coupled in series with the GaN transistor responsive to the feedback signal indicating that the magnitude of the current is above the threshold.

In one embodiment, the driver circuit is a GaN sequencer and is further constructed to apply the bias voltage to the gate terminal of the GaN transistor before turning on the transistor coupled in series with the GaN transistor. In one embodiment, the current sense circuit includes a first programmable level-shifter constructed to couple to a first terminal of a current sense resistance and a second programmable level-shifter constructed to couple to a second terminal of the current sense resistance.

In one embodiment, the feedback circuit includes a difference detector constructed to compare a voltage indicative of the magnitude of the current in the first transistor with a reference voltage that defines the threshold and generate the feedback signal based on the comparison. In one embodiment, the feedback circuit further includes a programmable voltage source constructed to generate the reference voltage and provide the reference voltage to the difference detector.

According to at least one aspect, a method for protecting an amplifier that is providing an output signal to a load is provided. The method includes monitoring a magnitude of a current in a first transistor of the amplifier, determining whether the magnitude of the current in the first transistor is above a threshold by comparing a voltage signal indicative of the magnitude of the current in the first transistor with a reference voltage, and reducing the magnitude of the current in the first transistor by adjusting a gate voltage of a second transistor in the power amplifier coupled in series with the first transistor responsive to determining that the magnitude of the current in the first transistor is above the threshold.

In one embodiment, the act of determining whether the magnitude of the current in the first transistor is above the threshold includes determining that the magnitude of the current in the first transistor is below the threshold responsive to the voltage signal being less than the reference voltage and determining that the magnitude of the current in the first transistor is above the threshold responsive to the voltage signal being greater than the reference voltage.

In one embodiment, the act of reducing the magnitude of the current in the first transistor includes turning off the second transistor. In one embodiment, the act of reducing the magnitude of the current in the first transistor includes adjusting a gate voltage of the second transistor and a third transistor, the third transistor being coupled to the second transistor. In one embodiment, the act of reducing the magnitude of the current in the first transistor includes turning off the second transistor and turning on the third transistor.

According to at least one aspect, a system for providing an output signal to a load is provided. The system includes a first transistor having a drain terminal constructed to provide the output to the load and a gate terminal constructed to receive a first input signal, a first circuit coupled to the gate terminal of the first transistor and constructed to apply a bias voltage to the gate terminal of the first transistor, a second circuit coupled to the first transistor and constructed to measure a magnitude of a current in the first transistor, a third circuit coupled to the second circuit and constructed to generate a feedback signal indicative of whether the magnitude of the current in the first transistor is above a threshold, and a fourth circuit coupled to the third circuit and the gate terminal of the first transistor, the fourth circuit being constructed to receive a second input signal and generate the first input signal based on the feedback signal and the second input signal, the first input signal being less than the magnitude of the second input signal responsive to the feedback signal indicating that the magnitude of the current in the first transistor is above the threshold.

In one embodiment, the threshold is a configurable threshold. In one embodiment, the system further includes a second transistor coupled in series with the first transistor, the second transistor having a gate terminal coupled to the driver circuit. In one embodiment, the first transistor is a gallium nitride (GaN) transistor and the second transistor is a metal-oxide-semiconductor field-effect transistor (MOSFET). In one embodiment, the first circuit is a GaN sequencer and is further constructed to apply the bias voltage to the gate terminal of the GaN transistor before turning on the MOSFET.

In one embodiment, the second circuit includes a current sense resistance coupled in series with the first transistor, a first level-shifter coupled to a first terminal of the current sense resistance, and a second level-shifter coupled to a second terminal of the current sense resistance. In one embodiment, the third circuit includes a difference detector constructed to compare the magnitude of the current in the first transistor with a reference voltage that defines threshold and generate the feedback signal based on the comparison. In one embodiment, the third circuit further includes a programmable voltage source constructed to generate the reference voltage and provide the reference voltage to the difference detector. In one embodiment, the first input signal has approximately the same magnitude as the second input signal responsive to the feedback signal indicating that the magnitude of the current in the first transistor is below the threshold.

According to at least one aspect, a circuit for protecting a gallium nitride (GaN) transistor is provided. The circuit includes a first circuit constructed to couple to a gate terminal of the GaN transistor and apply a bias voltage to the gate terminal of the GaN transistor, a second circuit constructed to measure a magnitude of a current in the GaN transistor, a third circuit coupled to the current sensing circuit and constructed to generate a feedback signal indicative of whether the magnitude of the current in the GaN transistor is above a threshold, and a fourth circuit constructed to couple to a gate terminal of the GaN transistor. The fourth circuit may be constructed to receive an input signal, generate an output signal based on the feedback signal and the input signal, and provide the output signal to the gate terminal of the GaN transistor, the output signal being less than the magnitude of the input signal responsive to the feedback signal indicating that the magnitude of the current in the GaN transistor is above the threshold.

In one embodiment, the first circuit is a GaN sequencer and is further constructed to apply the bias voltage to the gate terminal of the GaN transistor before turning on a transistor coupled in series with the GaN. In one embodiment, the second circuit includes a first programmable level-shifter constructed to couple to a first terminal of a current sense resistance and a second programmable level-shifter constructed to couple to a second terminal of the current sense resistance.

In one embodiment, the third circuit includes a difference detector constructed to compare the magnitude of the current in the first transistor with a reference voltage that defines the threshold and generate the feedback signal based on the comparison. In one embodiment, the third circuit further includes a programmable voltage source constructed to generate the reference voltage and provide the reference voltage to the difference detector. In one embodiment, the input signal has approximately the same magnitude as the output signal responsive to the feedback signal indicating that the magnitude of the current in the GaN transistor below the threshold.

According to at least one aspect, a method for protecting an amplifier that is providing an output signal to a load is provided. The method includes monitoring a magnitude of a current in a first transistor of the amplifier, determining whether the magnitude of the current in the first transistor is above a threshold by comparing a voltage signal indicative of the magnitude of the current in the first transistor with a reference voltage, and reducing the magnitude of the current in the first transistor by attenuating an input signal to the first transistor responsive to determining that the magnitude of the current in the first transistor is above the threshold.

In one embodiment, the act of determining whether the magnitude of the current in the first transistor is above the threshold includes determining that the magnitude of the current in the first transistor is below the threshold responsive to the voltage signal being less than the reference voltage and determining that the magnitude of the current in the first transistor is above the threshold responsive to the voltage signal being greater than the reference voltage. In one embodiment, the method further includes maintaining the magnitude of the input signal responsive to determining that the magnitude of the current in the first transistor is below the threshold.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. A depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. The terms "on" and "over" are used for ease of explanation relative to the illustrations, and are not intended as absolute directional references. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

As described above, transistors comprising gallium nitride (GaN) material are useful for high-speed, high-voltage, and high-power applications because of the favorable material properties of GaN. Some applications relating to RF communications, radar, and microwaves can place demanding performance requirements on devices that include GaN transistors. For example, some applications may require high-power transistors capable of amplifying signals to power levels between approximately 50 Watts and approximately 200 Watts.

The favorable properties of GaN transistors also come with new limitations relative to silicon based transistors. For example, the gate-to-source breakdown voltage of a GaN transistor may decrease as the temperature of the GaN transistor increases. The temperature of the GaN transistor may rise because of increases in the magnitude of the current in the GaN transistor caused by operating condition changes. The lower gate-to-source breakdown voltage increases the gate-to-source leakage current in the GaN transistor and may lead to the complete failure of the GaN transistor.

The inventors have appreciated that the failure of GaN transistors from excess heat caused by overcurrent conditions can be avoided by quickly reducing the magnitude of the current in the GaN transistor. The inventors have conceived and developed various circuits and operating methods thereof to monitor the magnitude of the current in the GaN transistor (or other device) and rapidly reduce the magnitude of the current in the GaN transistor when the GaN transistor is heating up. In some embodiments, these circuits maintain the temperature of a GaN transistor within an appropriate range by monitoring the magnitude of the current in the GaN transistor and reducing the magnitude of the current in the GaN transistor and/or shutting down the GaN transistor when the magnitude of the current is outside an appropriate range (and/or above a threshold). The circuitry to monitor and/or control the magnitude of the current in the GaN transistor may utilize complementary metal-oxide-semiconductor (CMOS) devices to advantageously react quickly (e.g., within three microseconds) to shut down the GaN transistor once an unsafe operation condition is detected. It should be appreciated that the circuits and associated methods disclosed herein may be readily applied to protect devices other than GaN transistors.

Figure 1B:
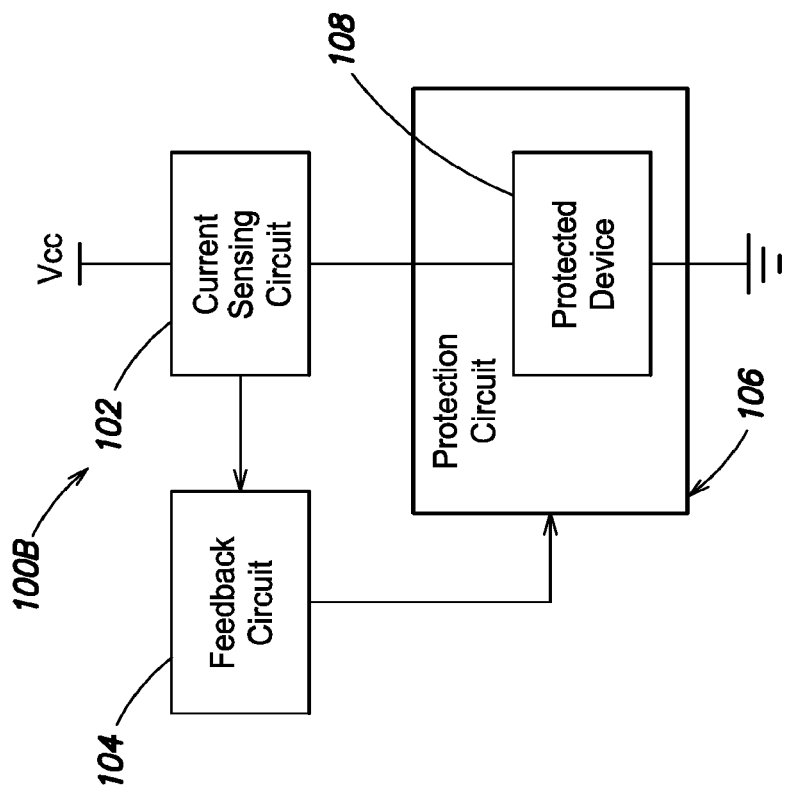
FIGS. 1A-1D each show an example circuit to protect a device from dangerous operating conditions, according to some embodiments.
Figure 1A:
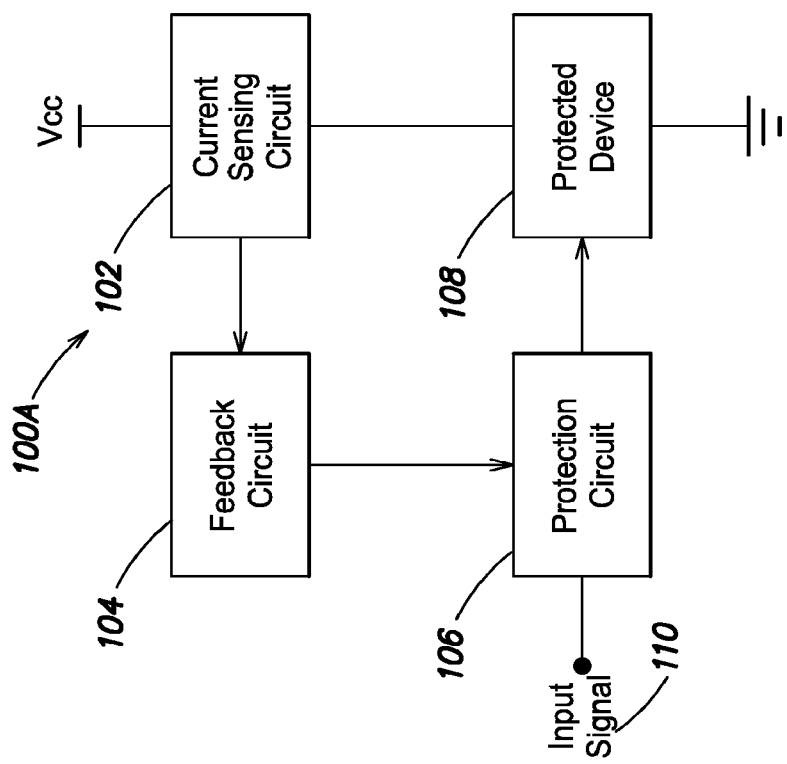

An example circuit for protecting a device, such as a GaN transistor, is depicted in FIG. 1A, according to some embodiments. The circuit 100A includes various components to monitor a magnitude of the current in a protected device 108 and reduce the magnitude of the current in the protected device 108 when the protected device 108 is operating outside a safe range (e.g., above a current threshold). By reducing the magnitude of the current in the protected device 108 during operating conditions that are hazardous to the protected device 108, the lifespan of the protected device 108 may be increased.

The circuit 100A includes a current sensing circuit 102 coupled between the supply voltage Vcc and the protected device 108. The current sensing circuit 102 is constructed to measure an amount of the current in a protected device 108. The current sensing circuit 102 may measure the current in the protected device 108 by any of a variety of methods. For example, the current sensing circuit 102 may include a current sense resistance coupled in series with the protected device 108 and measure a voltage drop across the current sense resistance to determine the magnitude of the current in the protected device 108.

A feedback circuit 104 is coupled to the current sensing circuit 102 and is constructed to receive a signal indicative of the magnitude of the current in the protected device 108 and determine whether the protected device 108 is operating within an appropriate range and/or above a threshold based on the magnitude of the current in the protected device 108. For example, the feedback circuit 104 may be constructed to compare the magnitude of the current in the protected device 108 with a current threshold and generate a feedback signal indicative of whether the magnitude of the current in the protected device 108 is above (or below) the threshold. It should be appreciated that the threshold comparison may be substituted for a range. For example, the feedback circuit 104 may determine whether the magnitude of the current in the protected device 108 is within either a safe range or a hazardous range.

The feedback signal generated by the feedback circuit 104 is provided to a protection circuit 106. The protection circuit 106 reduces the magnitude of the current in the protected device 108 and/or shuts down the protected device 108 responsive to the feedback signal indicating that the protected device 108 is operating outside of a safe range (e.g., above a current threshold). Otherwise, the protection circuit 106 allows the protected device 108 to continue operating without interruption.

The protection circuit 106 may reduce the current in the protected device 108 and/or shut down the protected device 108 by any of a variety of methods. The particular method employed may vary depending upon the location of the protection circuit 106 relative to the protected device 108. As shown in FIG. 1A for example, the protection circuit 106 is coupled to the protected device 108 and a device providing the input signal 110 (not illustrated) for the protected device 108. In this example, the protection circuit 106 may be constructed to reduce the magnitude of the current in the protected device 108 by attenuating the input signal 110 before providing the input signal 110 to the protected device 108. The protection circuit 106 may completely attenuate a magnitude of the voltage of the input signal 110 to zero responsive to any deviation from the safe range or gradually attenuate the magnitude of the voltage of the input signal 110 proportionally to the amount of deviation from the safe range. For example, the feedback signal from the feedback circuit 104 may indicate that the protected device 108 is only 5% over a threshold and the protection circuit 106 may reduce a magnitude of the input signal 110 by 20%. In this example, the protection circuit 106 may apply larger amounts of attenuation to the input signal 110 for larger deviations from the threshold. The feedback circuit 104 may also continually monitor feedback signal and further reduce the magnitude of the input signal 110 if the magnitude of the current in the protected device 108 does not fall below the threshold within a predetermined period of time.

In some embodiments, the protection circuit 106 may be integrated with the protected device 108 and/or circuitry constructed to control the protected device 108. Such an example circuit is illustrated by circuit 100B in FIG. 1B. In circuit 100B, the protection circuit 106 may directly control the protected device 108 and/or devices proximate the protected device 108. For example, the protected device 108 may be a GaN transistor in an amplifier and the protection circuit 106 may control the GaN transistor in addition to a metal-oxide-semiconductor field-effect transistor (MOSFET) coupled in series with the GaN transistor. In this example, the protection circuit 106 may reduce the magnitude of the current in the GaN transistor by turning off the MOSFET that is coupled in series with the GaN transistor.

It should be appreciated that the protection circuit 106 may be placed in other locations relative to the protected device 108. As shown in FIG. 1C, according to some embodiments, the protection circuit 106 may be coupled between the current sensing circuit 102 and the protected device 108. In these embodiments, the protection circuit 106 may reduce the magnitude of the current in the protected device 108 by turning off a transistor coupled in series with the protected device 108. By turning off a transistor coupled in series with the protected device 108, the total impedance between the supply voltage Vcc and ground is significantly increased and the magnitude of the current in the protected device 108 is reduced.

Figure 1D:
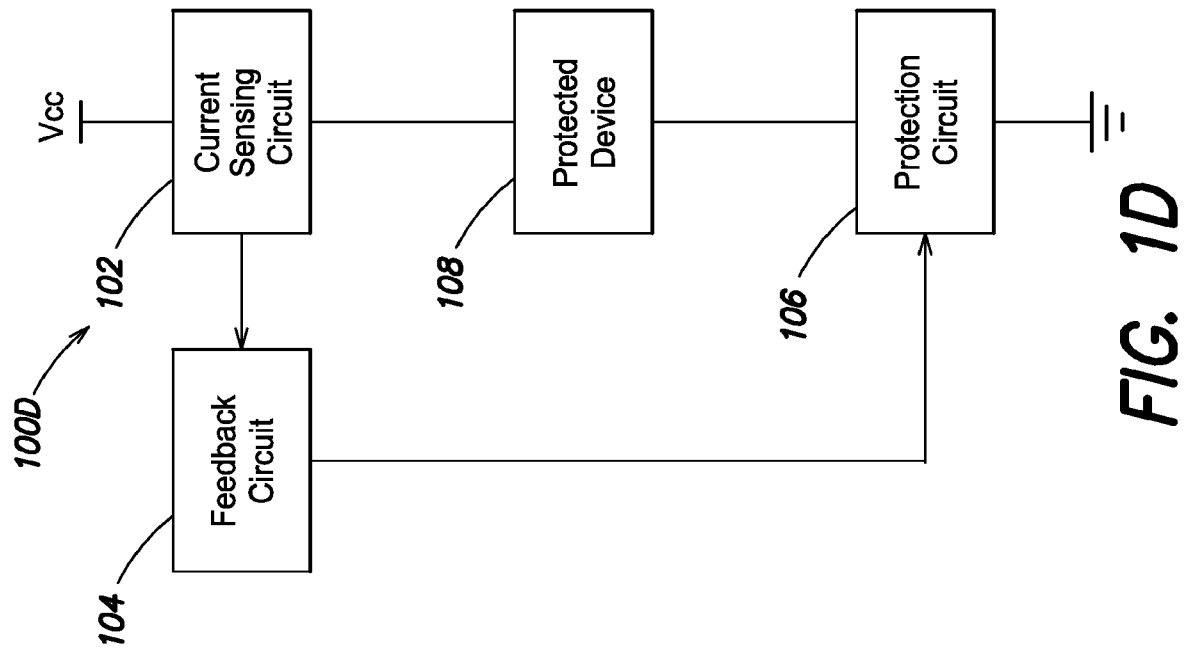
Figure 1C:
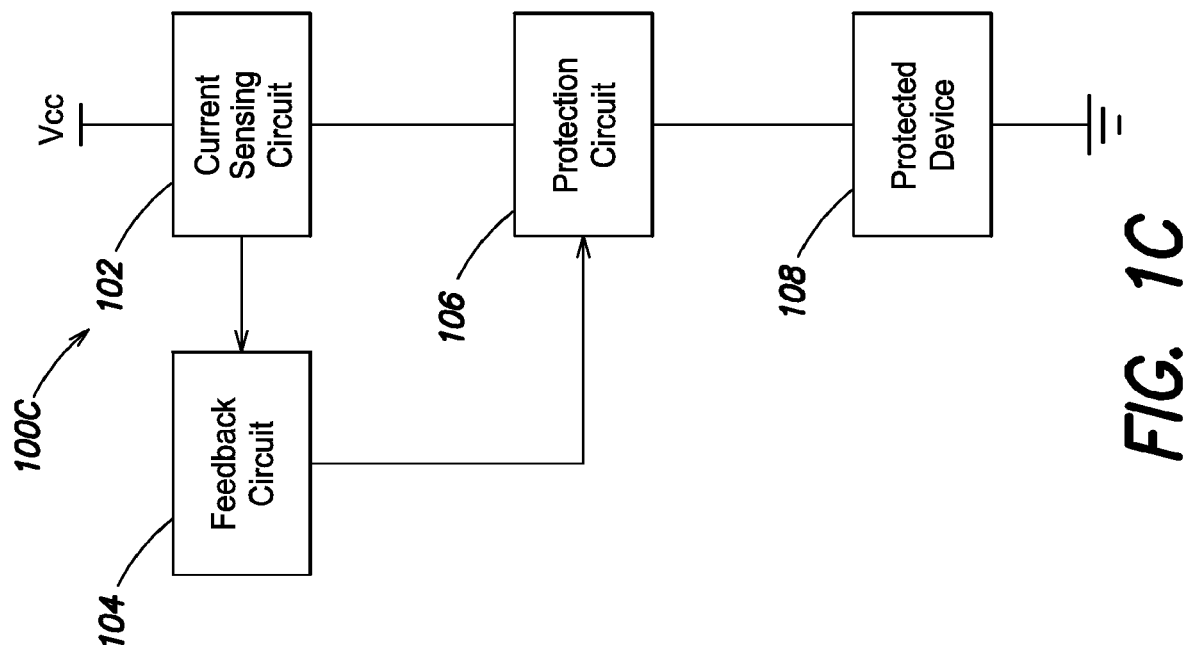

As shown in FIG. 1D, the protection circuit 106 may also be coupled between the protected device 108 and ground instead of between the current sensing circuit 102 and the protected device 108. The protection circuit 106 in FIG. 1D may operate similarly to the protection circuit 106 described above in FIG. 1C. For example, the protection circuit 106 may reduce the magnitude of the current in the protected device 108 by turning off a transistor coupled in series with the protected device 108.

In some embodiments, the feedback circuit 104 and/or the protection circuit 106 shown in FIGS. 1A-1D may be advantageously constructed from devices with a quick reaction time to increase the speed at which the circuits 100A-100D can react to changes in the magnitude of current. CMOS devices, for example, may have a propagation delay that is very small (e.g., 10 nanoseconds). Thereby, constructing the feedback circuit 104 and/or the protection circuit 106 from CMOS devices may yield fast reaction times (e.g., less than 1 microsecond) between the magnitude of current in the protected device 108 rising above a threshold and the magnitude of current in the protected device 108 being reduced below the threshold. It should be appreciated that the feedback circuit 104 and/or the protection circuit 106 may be constructed from devices other than CMOS devices.

Figure 2A:
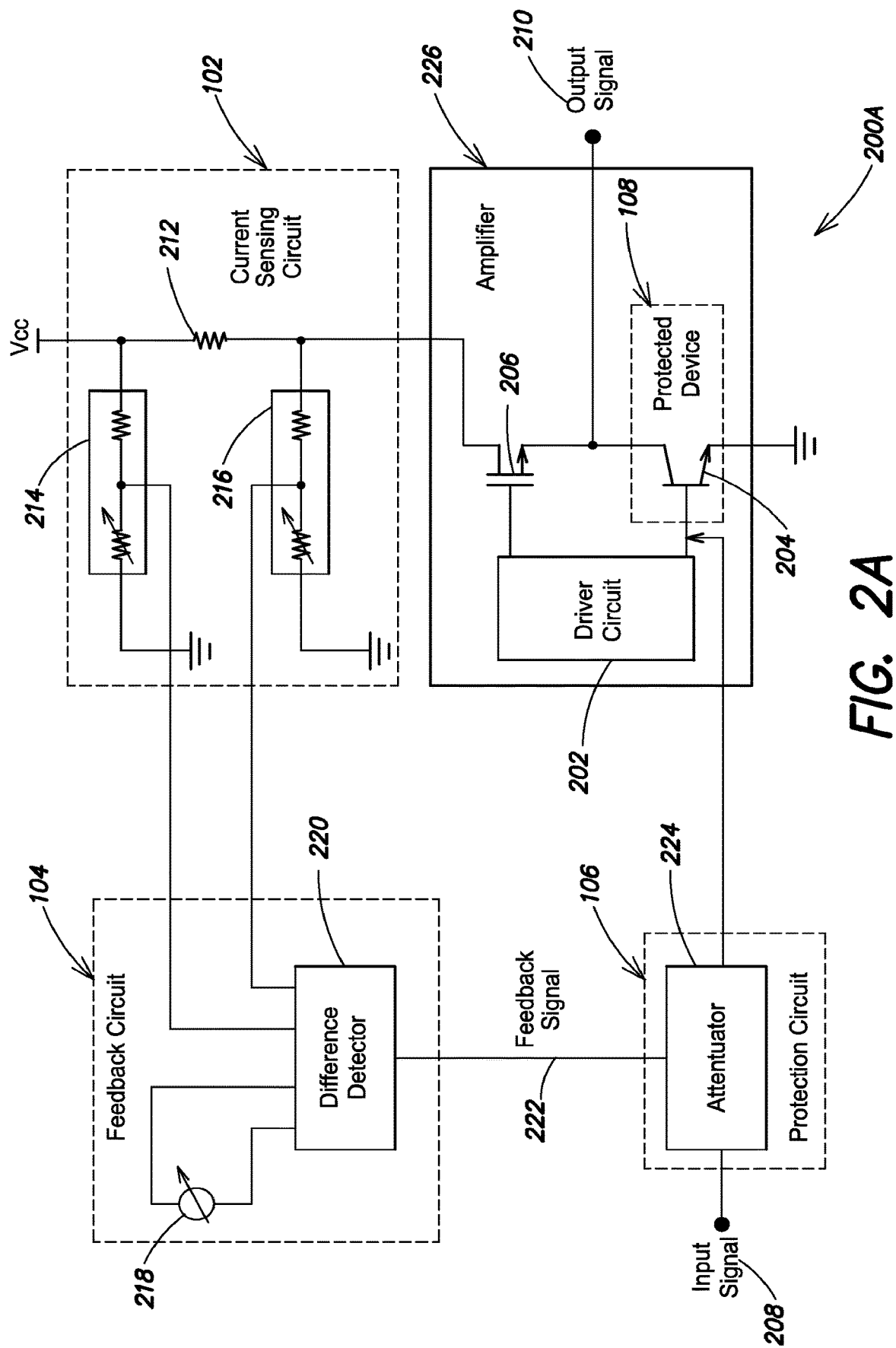
FIG. 2A shows an example amplifier system implementing the protection scheme shown in FIG. 1A, according to some embodiments.

As discussed above, various protection schemes may be employed to safeguard a particular device, such as a GaN transistor, from dangerous operating conditions. These protection schemes may be implemented in any of a variety of systems including, for example, amplifier systems. FIG. 2A illustrates such an example amplifier system 200A that implements the protection scheme shown in FIG. 1A above.

The amplifier system 200A includes an amplifier 226 constructed to receive and amplify the input signal 208 to generate the output signal 210. The amplifier 226 includes a first transistor 204 that performs the signal amplification and is also designated as the protected device 108. The amplifier system 200A protects the first transistor 204 by monitoring a magnitude of the current in the first transistor 204 and attenuating the input signal 208 when the first transistor 204 is operating in dangerous conditions. The first transistor 204 receives the input signal 208 at a gate terminal and provides the output signal 210 at a drain terminal. As shown, a source terminal of the first transistor 204 is connected to ground. A driver circuit 202 applies a bias voltage to the gate terminal first transistor 204 and also controls the operation of a second transistor 206 coupled in series with the first transistor 204. The second transistor 206 has a drain terminal coupled to the current sense resistor 212 and a source terminal coupled to the drain terminal of the first transistor 204.

It should be appreciated that the bias voltage from the driver circuit 202 and the input signal 208 may be combined by a combiner circuit (not illustrated) coupled between the driver circuit 202 and the gate terminal of the first transistor 204. For example, the combiner circuit may include an inductor coupled between the driver circuit 202 and the gate terminal of the first transistor 204 to pass the bias voltage and block higher frequencies in addition to a capacitor coupled between the gate terminal of the first transistor 204 and the protection circuit 106 to pass the input signal 208 and block lower frequencies.

As shown in FIG. 2A, the current sensing circuit 102 includes a current sense resistance 212 coupled between the supply voltage Vcc and the drain terminal of the second transistor 206. The current sense resistance 212 may be selected such that the voltage drop across the current sense resistance 212 is small to minimize the excess power dissipation caused by an additional impedance coupled between the supply voltage Vcc and ground. For example, the supply voltage Vcc may be between 30 and 50 Volts and the voltage drop across the current sense resistance 212 may be 1 Volt.

The current sense circuit 102 shown in FIG. 2A includes a first programmable level shifter coupled to a first terminal of the current sense resistance 212 and a second programmable level shifter coupled to a second terminal of the current sense resistance 212. The first and second programmable level shifters 214 and 216, respectively, may reduce a magnitude of the voltage at the ends of the current sense resistance 212 to a suitable range for the feedback circuit 104. For example, the programmable level shifters 214 and 216 may reduce a magnitude of the voltages to between 25 and 50 millivolts (mV). The impedance of the programmable level shifts 214 and 216 may be high to reduce the power losses. For example, the supply voltage Vcc may be between 30 and 50 Volts and the impedance of the programmable level shifters 214 and 216 may be at least 100,000 Ohms. It should be appreciated that various alternations may be made to the programmable level shifters 214 and 216 without departing from the scope of the present disclosure. For example, the variable impedances in the programmable level shifters 214 and 216 may be replaced with and/or programmable current sources. In another example, the programmable level shifters 214 and 216 may be replaced by fixed level shifters by replacing the variable impendence coupled to ground with a fixed impendence and/or a fixed current source. Further, the current sensing circuit 102 may include an amplification stage coupled to the programmable level shifters 214 and 216 to amplify the signal from the programmable level shifters 214 and 216.

The voltage across the two outputs of the programmable level shifters 214 and 216 is indicative of the magnitude of the current in the first transistor 204 and may be provided to the feedback circuit 104. As shown in FIG. 2A, the feedback circuit 104 includes a difference detector 220 coupled to the programmable level shifters 214 and 216 and a programmable reference generator 218 that generates a voltage reference indicative of a maximum current threshold. The difference detector 220 is constructed to compare the voltage reference from the programmable reference generator 218 with the voltage from programmable level shifters 214 and 216. Thereby, the difference detector 220 compares the magnitude of the current in the first transistor 204 with a threshold set by the programmable reference generator 218. The programmability of the programmable reference generator 218 may provide flexibility allowing, for example, the re-use of the same circuitry for different protected devices 108 with different sensitivities to current.

The feedback signal 222 may be indicative of whether the magnitude of the current in the first transistor 204 is above (or below) the threshold set by the programmable reference generator 218. For example, the difference detector 220 may indicate via the feedback signal 222 that the magnitude of the current in the first transistor 204 is above the threshold responsive to the voltage from the programmable level shifters 214 and 216 being greater than the reference voltage from the programmable reference generator 218. Conversely, the difference detector 220 may indicate via the feedback signal 222 that the magnitude of the current in the first transistor 204 is below the threshold responsive to the voltage from the programmable level shifters 214 and 216 being less than the voltage from the programmable reference generator 218.

In some embodiments, the feedback signal 222 generated by the difference detector 220 may be an analog signal. For example, the difference detector 220 may be implemented as a difference amplifier and the feedback signal 222 provided by the difference amplifier may be indicative of a difference between the voltage from the programmable level shifters 214 and 216 and the voltage from the programmable reference generator 218.

It should be appreciated that the feedback circuit 104 may be constructed to compare the magnitude of the current in the first transistor 204 to multiple thresholds and/or ranges depending upon the particular implementation. For example, the difference detector 220 may receive multiple reference voltages and compare the voltage from the programmable level shifters 214 and 216 to each of the reference voltages. In this example, the difference detector 220 may identify the closest reference voltage that is above the voltage from the programmable level shifters 214 and 216 and the closest reference voltage that is below the voltage from the programmable level shifters 214 and 216 to identify a range that the magnitude of the current falls within. Based on which range that the magnitude of the current falls within, the protection circuit 106 may take appropriate action to reduce the magnitude of the current in the first transistor 204 or allow the first transistor 204 to continue operating without interruption.

As shown in FIG. 2A, the protection circuit 106 receives the input signal 208 and attenuates the input signal 208 based on the feedback signal 222 before providing the input signal 208 to the gate terminal of the first transistor 204. The attenuation of the input signal 208 in the protection circuit 106 may be performed by an attenuator 224. The attenuator 224 may attenuate the input signal 208 to (or near) zero responsive to the feedback signal 222 indicating that the magnitude of the current in the first transistor 204 is above the threshold. Alternatively, the attenuator 224 may apply attenuation to the input signal 208 gradually as the current in the first transistor 204 exceeds a threshold and/or particular thresholds in a set of thresholds. For example, the feedback signal 222 may indicate that the magnitude of the current in the first transistor 204 is between the two lowest thresholds (e.g., in a first range) and attenuator 224 may slightly attenuate the input signal 208. The attenuator 224 may apply larger amounts of attenuation when the feedback signal 222 indicates that the magnitude of the current in the first transistor 204 is above the two lowest thresholds (e.g., in a second range). In another example, the feedback signal 222 may be an analog signal that indicates the deviation between the magnitude of current in the first transistor 204 and a threshold. In this example, the magnitude of attenuation applied by attenuator 224 may be proportional to the magnitude of the deviation indicated by the feedback signal 222. The attenuator 224 may also modify the amount of attenuation based on the response exhibited by the first transistor 204. For example, the attenuator 224 may first apply a small level of attenuation to the input signal 208 responsive to the magnitude of the current being above the lowest threshold and subsequently increase the amount of attenuation applied to the input signal 208 responsive to the magnitude of the current remaining above the lowest threshold.

Figure 2B:
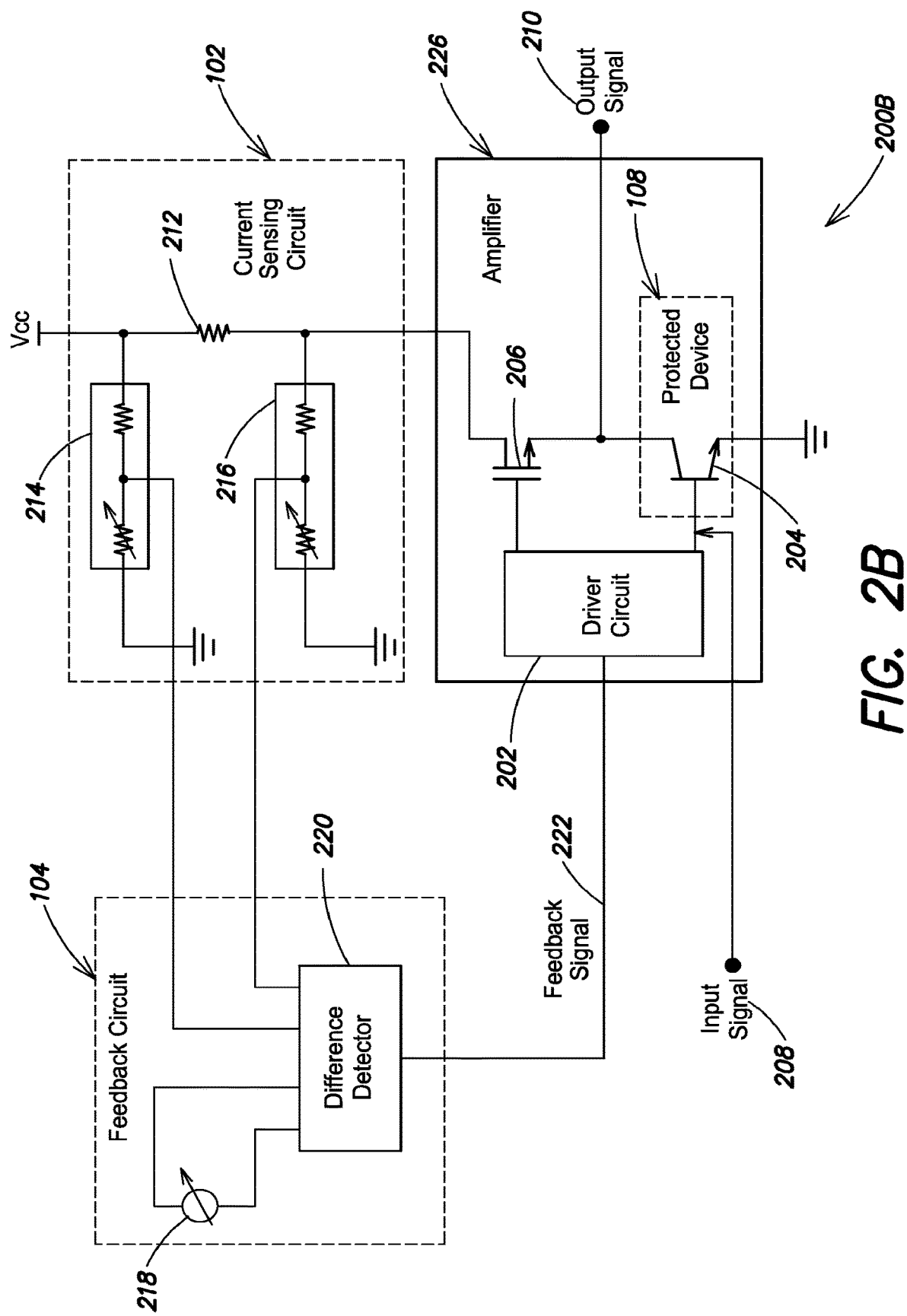
FIGS. 2B and 2C each show an example amplifier system implementing the protection scheme shown in FIG. 1B, according to some embodiments.

As discussed above with reference to FIG. 1B, the functionality of the protection circuit 106 may be integrated with the protected device 108 and/or integrated with the circuitry that controls operation of the protected device 108. FIG. 2B illustrates such an example amplifier system 200B with the functionality of the protection circuit integrated into the amplifier 226. Integrating the functionality of the protection circuit into the amplifier may advantageously simplify the construction of the amplifier system 200B by leveraging existing devices to perform various functions performed by the protection circuit. Thereby, the cost and complexity of manufacturing the amplifier system may be reduced.

As shown in FIG. 2B, the feedback signal 222 from the feedback circuit 104 is provided to the driver circuit 202 of the amplifier 226. In this implementation, the driver circuit 202 may be constructed to control operation of the second transistor 206 based on the feedback signal 222. For example, the feedback signal 222 may indicate that the magnitude of the current in the first transistor 204 is above the threshold and the driver circuit 202 may turn off the second transistor 206 to reduce the magnitude of the current in the first transistor. If the feedback signal 222 indicates that the magnitude of the current in the first transistor 204 is below the threshold, the driver circuit 202 may turn on the second transistor 206 (or keep the second transistor 206 on). Thereby, the functionality of the protection circuit is integrated into existing components of the amplifier 226 (e.g., the driver circuit 202 and the second transistor 206).

Figure 2C:
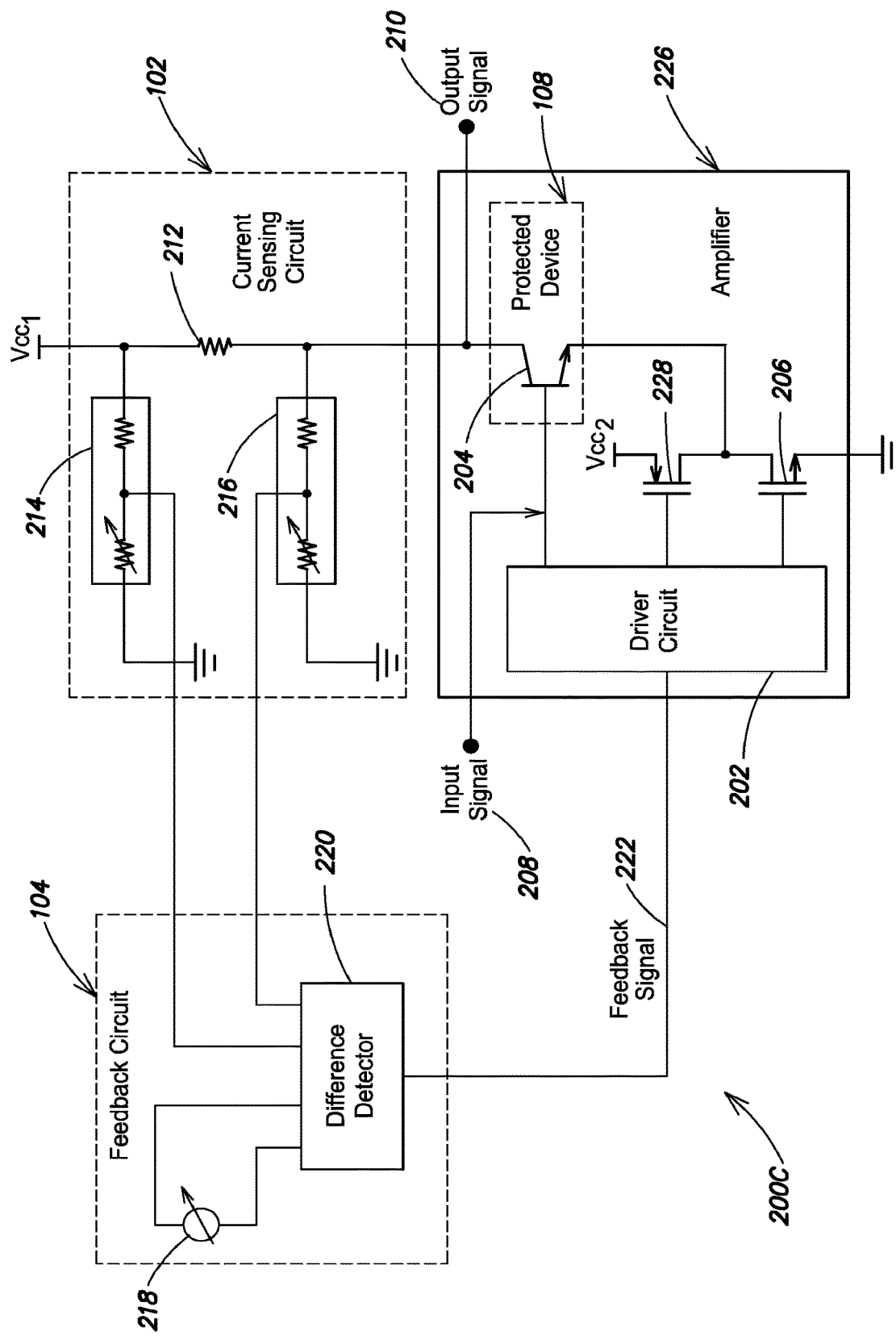

FIG. 2C illustrates another example amplifier system 200C with the functionality of the protection circuit integrated into the amplifier 226. As shown in FIG. 2C, the drain terminal of the second transistor 206 is coupled to the source terminal of the first transistor 204 instead of the drain terminal of the first transistor 204 as shown in FIGS. 2A and 2B. The amplifier 226 shown in FIG. 2C further includes a third transistor 228 coupled in series with the second transistor 206. The third transistor 228 has a source terminal coupled to a second supply voltage $Vcc_2$, a gate terminal coupled to the driver circuit 202, and a drain terminal coupled to the drain terminal of the second transistor 206. In this implementation, the driver circuit 202 is constructed to reduce the magnitude of the current in the first transistor 204 by simultaneously turning off the second transistor 206 and turning on the third transistor 228 to increase the voltage level at the source terminal of the first transistor 204. For example, turning off the second transistor 206 and turning on the third transistor 228 raises the voltage level at the source terminal of the first transistor 204 from ground to $Vcc_2$. By increasing the voltage at the source terminal of the first transistor 204, both the voltage drop across the first transistor 204 and the magnitude of the current in the first transistor 204 are reduced. The driver circuit 202 may turn on the second transistor 206 and turn off the third transistor 228 during normal operation when the magnitude of the current in the first transistor 204 is below the threshold.

As shown in FIG. 2C, the third transistor 228 may be a p-type transistor while the second transistor 206 may be an n-type transistor. Implementing the second and third transistors 206 and 228, respectively, as different types may allow the driver circuit to apply a similar (or same) control signal to both transistors and achieve the desired modes of operation. For example, a first control signal may be sent to the second and third transistors 206 and 228, respectively, to turn off the second transistor 206 and turn on the third transistor 228 to increase the voltage applied to the source terminal of the first transistor 204. Conversely, a second control signal may be sent to the second and third transistors 206 and 228, respectively, to turn on the second transistor 206 and turn off the third transistor 228 to ground the source terminal of the first transistor 204.

In some embodiments, the amplifier 226 shown in each of FIGS. 2A-2C includes a GaN transistor. For example, the first transistor 204 may be a GaN transistor and the second transistor 206 may be formed from a different type of semiconductor, such as a silicon metal-oxide-semiconductor field-effect transistor (MOSFET). In these embodiments, the driver circuit 202 may be a GaN sequencer that is constructed to apply the bias voltage to the GaN transistor before turning on the MOSFET to avoid damage to the GaN transistor. In the implementations shown in FIGS. 2B and 2C, the GaN sequencer may control the second transistor 206 to both properly sequence the GaN transistor and also reduce the current in the GaN transistor responsive to the magnitude of the current in the GaN transistor exceeding a threshold.

Figure 3:
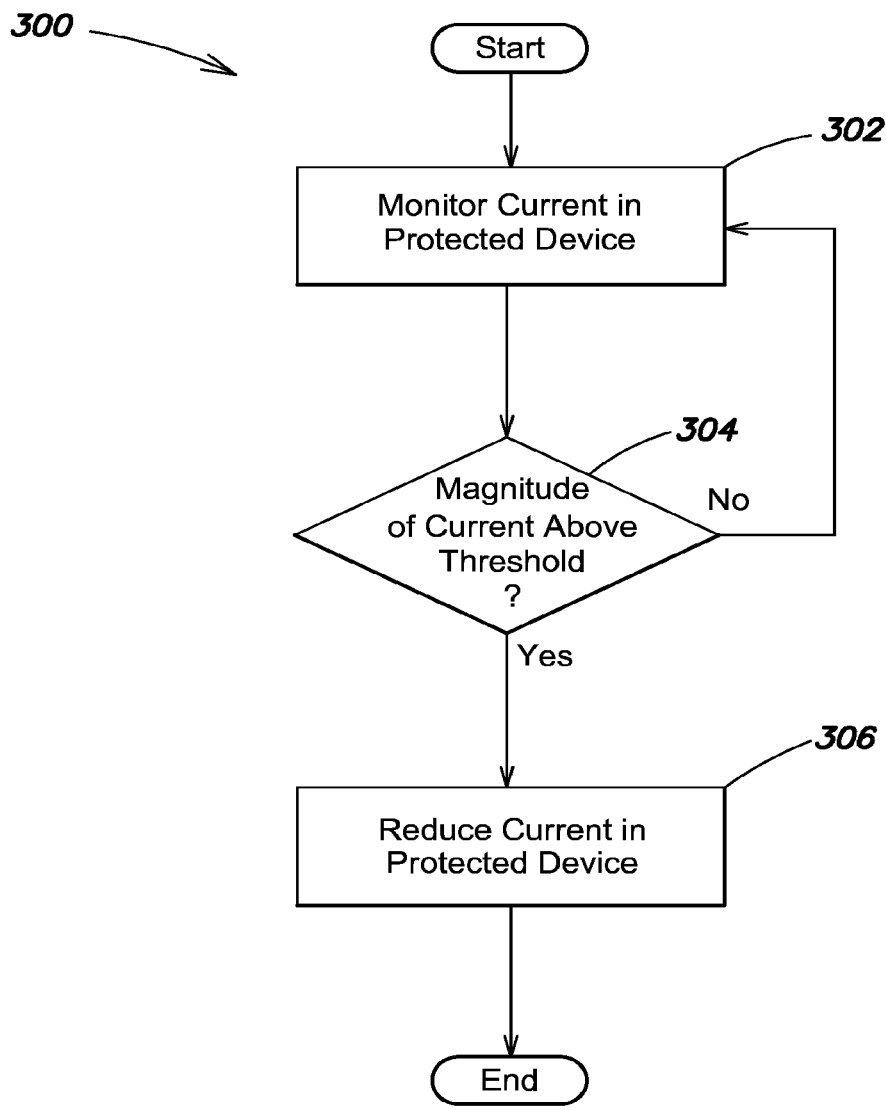
FIG. 3 shows an example method of operation of a circuit to protect a device from dangerous operating conditions, according to some embodiments.

As discussed above, various circuits may be designed to protect a device, such as a GaN transistor, from damage caused by hazardous operating conditions. FIG. 3 illustrates an example method of operation 300 for these circuits according to some embodiments. The method 300 protects a device by monitoring a magnitude of the current in a protected device and determining whether the magnitude of the current in the protected device is above a threshold. If the magnitude of the current in the protected device is above the threshold, the magnitude of the current in the protected device is reduced. Otherwise, the protected device is allowed to continue operating without interruption.

In act 302, the circuit monitors the magnitude of the current in the protected device. The protected device may include a GaN transistor or other device that is sensitive to heat and/or current. The circuit may monitor the current in the protected device by any of a variety of methods. For example, the circuit may include a current sense resistance coupled in series with the protected device and the circuit may measure a voltage drop across the current sense resistance to determine a magnitude of the current in the protected device.

In act 304, the circuit determines whether the magnitude of the current in the protected device is above a threshold. The circuit may include, for example, a difference detector that is constructed to compare a voltage reference that is indicative of the threshold with a voltage signal indicative of the magnitude of the current in the protected device. In this example, the circuit may indicate that the magnitude of the current in the protected device is above the threshold responsive to the voltage signal indicative of the magnitude of the current in the protected device being larger than the voltage reference. Conversely, the circuit may indicate that the magnitude of the current in the protected device is below the threshold responsive to the voltage signal indicative of the magnitude of the current in the protected device being less than the voltage reference. If the magnitude of the current in the protected device is above the threshold, the circuit proceeds to act 306 to reduce the current in the protected device. Otherwise, the circuit returns to act 302 and continues to monitor the magnitude of the current in the protected device.

The circuit may employ any of a variety of methods in act 306 to reduce the magnitude of the current in the protected device. For example, the circuit may turn off a transistor coupled in series with the protected device and/or attenuate an input signal to the protected device. In examples where the protected device is a transistor, the circuit may also raise a voltage level at a source terminal of the transistor to both reduce a voltage drop across the transistor and reduce a magnitude of the current in the transistor.

It should be appreciated that the circuit may compare the magnitude of the current in the protected device with multiple thresholds or ranges in act 304. For example, the circuit may determine whether the magnitude of the current in the protected device is within a first range that is safe for the protected device or a second higher range that is unsafe for the protected device. In this example, the circuit may proceed to act 306 responsive to the protected device operating in the second higher range. Otherwise, the circuit may return to act 302 and continue monitoring the protected device.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for providing an output signal to a load, comprising:
   a transistor comprising a gate terminal and a drain terminal, the drain terminal capable of providing the output signal to the load and the gate terminal capable of receiving a first input signal;
   a first circuit capable of measuring a magnitude of a current in the transistor;
   a second circuit capable of generating a feedback signal indicative of whether the magnitude of the current in the transistor is above a threshold; and
   a third circuit coupled to the gate terminal of the transistor, the third circuit being capable of receiving a second input signal and generating the first input signal based on the feedback signal and the second input signal, a magnitude of a voltage of the first input signal being less than a magnitude of a voltage of the second input signal in response to the feedback signal indicating that the magnitude of the current in the transistor is above the threshold.

2. The circuit of claim 1, wherein the third circuit is capable of reducing the magnitude of the current in the transistor in response to the feedback signal indicating that the magnitude of the current in the transistor is above a threshold.

3. The circuit of claim 1, wherein, to generate the first input signal, the third circuit is capable of completely attenuating the magnitude of the voltage of the second input signal in response to the feedback signal indicating that the magnitude of the current in the transistor is above the threshold.

4. The circuit of claim 1, wherein, to generate the first input signal, the third circuit is capable of proportionately attenuating the magnitude of the voltage of the second input signal in response to the magnitude of the current in the transistor.

5. The circuit of claim 1, further comprising a second transistor coupled to the transistor, wherein the transistor comprises a gallium nitride (GaN) transistor and the second transistor comprises a metal-oxide-semiconductor field-effect transistor (MOSFET).

6. The circuit of claim 1, further comprising a second transistor coupled to a source of the transistor.

7. The circuit of claim 1, further comprising a second transistor coupled to a drain of the transistor.

8. The circuit of claim 1, further comprising:
   a second transistor coupled to the transistor; and
   a fourth circuit capable of applying a bias voltage to the gate terminal of the transistor before turning on the second transistor.

9. The circuit of claim 1, further comprising:
   a second transistor coupled to the transistor, wherein:
   the third circuit is further capable of:
      applying a bias voltage to the gate terminal of the transistor before turning on the second transistor; and
      reducing the magnitude of the current in the transistor in response to the feedback signal indicating that the magnitude of the current in the transistor is above a threshold.

10. The circuit of claim 1, wherein the second circuit comprises a current sense resistance coupled in series with the transistor, a first programmable level-shifter coupled to a first terminal of the current sense resistance, and a second programmable level-shifter coupled to a second terminal of the current sense resistance.

11. The circuit of claim 1, wherein the second circuit comprises a difference detector capable of comparing the magnitude of the current in the transistor with a reference voltage and generating the feedback signal based on the comparison.

12. The circuit of claim 11, wherein the second circuit comprises a programmable voltage source capable of generating the reference voltage and providing the reference voltage to the difference detector.

13. A device protection circuit, comprising:
   an amplifier comprising a transistor;
   a current sensing circuit capable of measuring a current in the transistor;
   a feedback circuit capable of generating a feedback signal based on the current in the transistor; and
   a protection circuit capable of completely attenuating a magnitude of an input signal provided to a gate terminal of the transistor in response to the feedback signal indicating that a magnitude of the current in the transistor is above a threshold.

14. A device protection circuit, comprising:
   an amplifier comprising a transistor;
   a current sensing circuit capable of measuring a current in the transistor;
   a feedback circuit capable of generating a feedback signal indicating a magnitude of the current in the transistor; and
   a protection circuit capable of proportionately attenuating a magnitude of an input signal provided to a gate terminal of the transistor in response to the magnitude of the current in the transistor.

15. A device protection circuit, comprising:
   an amplifier comprising a transistor and a second transistor;
   a current sensing circuit capable of measuring a current in the transistor;

a feedback circuit capable of generating a feedback signal based on a comparison between the current in the transistor and a programmable reference threshold; and a protection circuit capable of reducing the current in the transistor in response to the feedback signal indicating that the current in the transistor is above the programmable reference threshold, wherein:

the transistor comprises a gallium nitride (GaN) transistor; and the second transistor comprises a metal-oxide-semiconductor field-effect transistor (MOSFET).

16. The device protection circuit of claim 15, wherein the second transistor is coupled to a source of the transistor or a drain of the transistor.

17. A device protection circuit, comprising:

an amplifier comprising a transistor and a second transistor coupled to the transistor;

a driver circuit capable of applying a bias voltage to a gate terminal of the transistor before turning on the second transistor;

a current sensing circuit capable of measuring a current in the transistor;

a feedback circuit capable of generating a feedback signal based on a comparison between the current in the transistor and a programmable reference threshold; and a protection circuit capable of reducing the current in the transistor in response to the feedback signal indicating that the current in the transistor is above the programmable reference threshold.

18. The device protection circuit of claim 17, wherein:

the driver circuit incorporates the protection circuit; and the driver circuit is further capable of controlling the second transistor to reduce the current in the transistor in response to the feedback signal indicating that the current in the transistor is above the programmable reference threshold.

19. A device protection circuit, comprising:

an amplifier comprising a transistor;

a current sensing circuit capable of measuring a current in the transistor;

a feedback circuit capable of generating a feedback signal based on the current in the transistor; and a protection circuit capable of reducing the current in the transistor in response to the feedback signal indicating that the current in the transistor is above a threshold, wherein:

the current sensing circuit comprises a current sense resistance coupled in series with the transistor, a first programmable level-shifter coupled to a first terminal of the current sense resistance, and a second programmable level-shifter coupled to a second terminal of the current sense resistance.

20. The device protection circuit of claim 19, wherein the feedback circuit comprises a difference detector capable of comparing the current in the transistor with a reference voltage and generating the feedback signal based on the comparison.

* * * * *